United States Patent
Zhang et al.

(10) Patent No.: US 10,177,119 B2
(45) Date of Patent: Jan. 8, 2019

(54) FAN OUT SEMICONDUCTOR DEVICE INCLUDING A PLURALITY OF SEMICONDUCTOR DIE

(71) Applicant: SANDISK INFORMATION TECHNOLOGY (SHANGHAI) CO., LTD., Shanghai (CN)

(72) Inventors: Cong Zhang, Shanghai (CN); Fuqiang Xiao, Shanghai (CN); Bin Xu, Shanghai (CN); Haijun Wu, Shanghai (CN); Chin Tien Chiu, Taichung (TW); Zengyu Zhou, Shanghai (CN)

(73) Assignee: SanDisk Information Technology (Shanghai) Co., Ltd., Shanghai (CN)

( * ) Notice: Subject to any disclaimer, the term of this patent is extended or adjusted under 35 U.S.C. 154(b) by 0 days.

(21) Appl. No.: 15/619,895

(22) Filed: Jun. 12, 2017

(65) Prior Publication Data

US 2018/0019228 A1    Jan. 18, 2018

(30) Foreign Application Priority Data

Jul. 12, 2016  (CN) .......................... 2016 1 0546249

(51) Int. Cl.
*H01L 25/04* (2014.01)
*H01L 25/07* (2006.01)
(Continued)

(52) U.S. Cl.
CPC ...... *H01L 25/0657* (2013.01); *H01L 21/6835* (2013.01); *H01L 24/14* (2013.01); *H01L 24/49* (2013.01); *H01L 25/50* (2013.01); *H01L 21/568* (2013.01); *H01L 23/3128* (2013.01); *H01L 25/043* (2013.01); *H01L 25/0652* (2013.01); *H01L 25/071* (2013.01);
(Continued)

(58) Field of Classification Search
CPC ............... H01L 25/0657; H01L 25/043; H01L 25/0756; H01L 25/117; H01L 25/0652; H01L 25/071; H01L 25/112; H01L 25/074; H01L 24/14; H01L 24/49
See application file for complete search history.

(56) References Cited

U.S. PATENT DOCUMENTS 6,215,182 B1 *  4/2001  Ozawa ................ H01L 23/3128
                                                      257/723
7,911,045 B2 *  3/2011  Matsushima ......... H01L 21/568
                                                      257/686

(Continued)

OTHER PUBLICATIONS

Office Action dated Jun. 21, 2018 in Korean Patent Application No. 10-2017-0079148, 5 pages.

*Primary Examiner* — Ida M Soward
(74) *Attorney, Agent, or Firm* — Vierra Magen Marcus LLP

(57) ABSTRACT

A semiconductor package is disclosed including a number of stacked semiconductor die, electrically connected to each other with wire bonds. The stacked semiconductor die are provided in a mold compound such that a spacing exists between a top die in the die stack and a surface of the mold compound. The wire bonds to the top die may be provided in the spacing. An RDL pad is affixed to the surface of the mold compound. Columns of bumps may be formed on the die bond pads of the top die in the die stack to electrically couple the RDL pad to the die stack across the spacing.

20 Claims, 8 Drawing Sheets

(51) Int. Cl.
  *H01L 25/11* (2006.01)
  *H01L 25/065* (2006.01)
  *H01L 23/00* (2006.01)
  *H01L 21/683* (2006.01)
  *H01L 25/00* (2006.01)
  *H01L 25/075* (2006.01)
  *H01L 23/31* (2006.01)
  *H01L 21/56* (2006.01)

(52) U.S. Cl.
  CPC ........ *H01L 25/074* (2013.01); *H01L 25/0756* (2013.01); *H01L 25/112* (2013.01); *H01L 25/117* (2013.01); *H01L 2224/1401* (2013.01); *H01L 2224/49107* (2013.01); *H01L 2225/06506* (2013.01); *H01L 2225/06517* (2013.01); *H01L 2225/06527* (2013.01); *H01L 2225/06562* (2013.01); *H01L 2924/1438* (2013.01); *H01L 2924/15172* (2013.01); *H01L 2924/181* (2013.01)

(56) References Cited

U.S. PATENT DOCUMENTS

| | | | | |
|---|---|---|---|---|
| 7,944,037 B2* | 5/2011 | Nishiyama | .......... | H01L 23/3121 257/686 |
| 8,115,293 B2* | 2/2012 | Moon | ................. | H01L 23/3128 257/686 |
| 8,125,092 B2* | 2/2012 | Corisis | ................ | H01L 23/3128 257/784 |
| 8,253,232 B2* | 8/2012 | Kim | ................... | H01L 23/3128 257/686 |
| 8,331,121 B2* | 12/2012 | Hong | ....................... | G11C 5/06 257/686 |
| 8,436,455 B2* | 5/2013 | Eun | ....................... | H01L 23/481 257/686 |
| 8,525,349 B2* | 9/2013 | Song | ....................... | H01L 22/32 257/686 |
| 8,611,125 B2* | 12/2013 | Hong | ....................... | G11C 5/06 257/686 |
| 8,723,333 B2* | 5/2014 | Park | .................. | H01L 23/49575 257/686 |
| 8,749,040 B2* | 6/2014 | Chi | ..................... | H01L 25/0657 257/686 |
| 8,796,076 B2* | 8/2014 | Yoshimura | ............. | H01L 24/75 438/106 |
| 9,418,922 B2* | 8/2016 | Paek | ................ | H01L 23/49816 |
| 9,673,178 B2* | 6/2017 | Yuan | ...................... | H01L 24/45 |
| 9,899,354 B2* | 2/2018 | Zhao | .................. | H01L 25/0657 |
| 2008/0029884 A1* | 2/2008 | Grafe | ................ | H01L 23/5385 257/723 |
| 2008/0105984 A1* | 5/2008 | Lee | ..................... | H01L 23/3128 257/777 |
| 2010/0193930 A1* | 8/2010 | Lee | .................. | H01L 23/49816 257/686 |
| 2012/0007227 A1* | 1/2012 | Cho | ...................... | H01L 21/568 257/686 |
| 2013/0062758 A1* | 3/2013 | Imoto | .................. | H01L 23/3135 257/737 |
| 2013/0114323 A1* | 5/2013 | Shindo | ................ | H01L 25/0657 365/63 |
| 2014/0225273 A1* | 8/2014 | Thacker | .............. | H01L 23/5384 257/774 |
| 2015/0123273 A1* | 5/2015 | Cho | ....................... | H01L 21/56 257/737 |
| 2015/0123288 A1* | 5/2015 | Lee | ..................... | H01L 23/5389 257/777 |
| 2017/0278821 A1* | 9/2017 | Zhao | ..................... | H01L 24/19 |
| 2017/0294410 A1* | 10/2017 | Haba | .................. | H01L 25/0657 257/686 |

* cited by examiner

FAN OUT SEMICONDUCTOR DEVICE INCLUDING A PLURALITY OF SEMICONDUCTOR DIE

BACKGROUND

The strong growth in demand for portable consumer electronics is driving the need for high-capacity storage devices. Non-volatile semiconductor memory devices, such as flash memory storage cards, are becoming widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs and cellular telephones.

While many varied packaging configurations are known, flash memory storage cards may in general be fabricated as system-in-a-package (SiP) or multichip modules (MCM), where a plurality of die are mounted and interconnected on a small footprint substrate. The substrate may in general include a rigid, dielectric base having a conductive layer etched on one or both sides. Electrical connections are formed between the die and the conductive layer(s), and the conductive layer(s) provide an electric lead structure for connection of the die to a host device. Once electrical connections between the die and substrate are made, the assembly is then typically encased in a mold compound which provides a protective package.

One type of semiconductor package is a so-called fan out chip-scale package, where a semiconductor die is embedded in a mold compound with an active surface of the semiconductor die including the die bond pads being coplanar with a surface of the mold compound. A first surface of a redistribution layer is then affixed to the active surface of the semiconductor die and mold compound. The redistribution layer includes a second surface having solder balls for mounting the fan out package to a host device.

A cross-sectional side view a conventional fan out chip-scale semiconductor package 20 is shown in FIG. 1. Package 20 includes a semiconductor die, such as flash memory die 22. The semiconductor die 22 may be encased in a mold compound 24, with a surface 26 of the die 22 including die bond pads 28 being coplanar with a surface of the mold compound 24. A redistribution layer 30 may then be affixed to the coplanar surface of the die 22 and mold compound 24. The redistribution layer 30 electrically connects the die bond pads 28 of die 22 to solder bumps 32 via electrical traces 34 and vias 36 within the redistribution layer 30. The solder bumps 32 may be surface mounted to a host device such as a printed circuit board to electrically connect the package 20 the host device.

In fan out chip-scale packages such as package 20, there is room for a single semiconductor die, i.e., the semiconductor die 22 which lies directly against the redistribution layer 30. As the die bond pads 28 of die 22 lie directly against the electrical contacts in the adjacent surface of the redistribution layer 30, there is no room for electrical connection of additional die to the redistribution layer 30.

DETAILED DESCRIPTION

The present technology will now be described with reference to the figures, which in embodiments, relate to a fan out semiconductor device including a plurality of semiconductor die. It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

The terms "top" and "bottom," "upper" and "lower" and "vertical" and "horizontal" as may be used herein are by way of example and illustrative purposes only, and are not meant to limit the description of the invention inasmuch as the referenced item can be exchanged in position and orientation. Also, as used herein, the terms "substantially," "approximately" and/or "about" mean that the specified dimension or parameter may be varied within an acceptable manufacturing tolerance for a given application. In one embodiment, the acceptable manufacturing tolerance is ±0.25%.

An embodiment of the present invention will now be explained with reference to the flowchart of FIG. 2 and the partial perspective and edge views of FIGS. 3 through 13. FIGS. 3 through 10 each show an individual semiconductor package 100, or a portion thereof. However, as explained below with respect to FIG. 11, the packages 100 may be batch processed along with a plurality of other packages on a carrier to achieve economies of scale. The number of rows and columns of package 100 on the carrier may vary.

Figure 1:
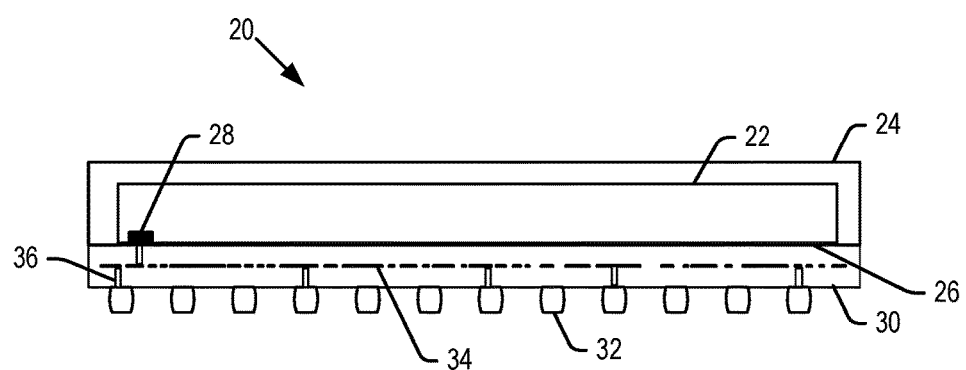
FIG. 1 is a cross-sectional edge view of a conventional fan out chip-scale semiconductor package.
Figure 2:
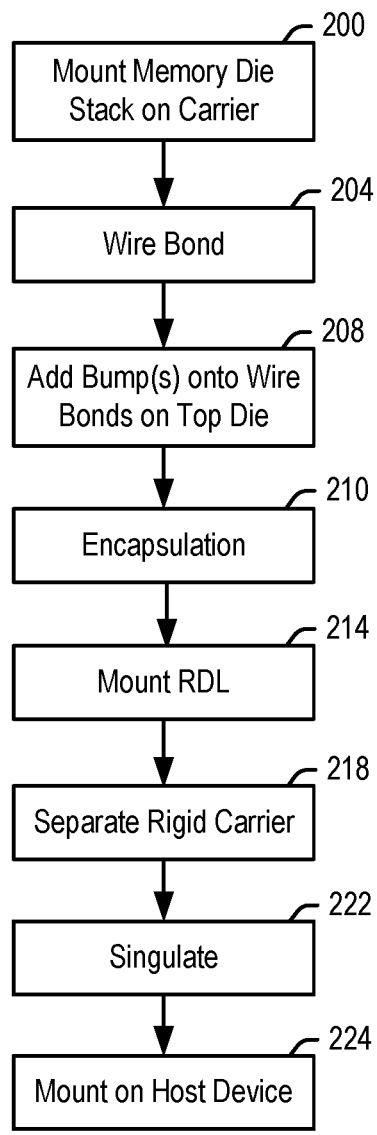
FIG. 2 is a flowchart for the assembly of a semiconductor device according to embodiments of the present technology.
Figure 3:
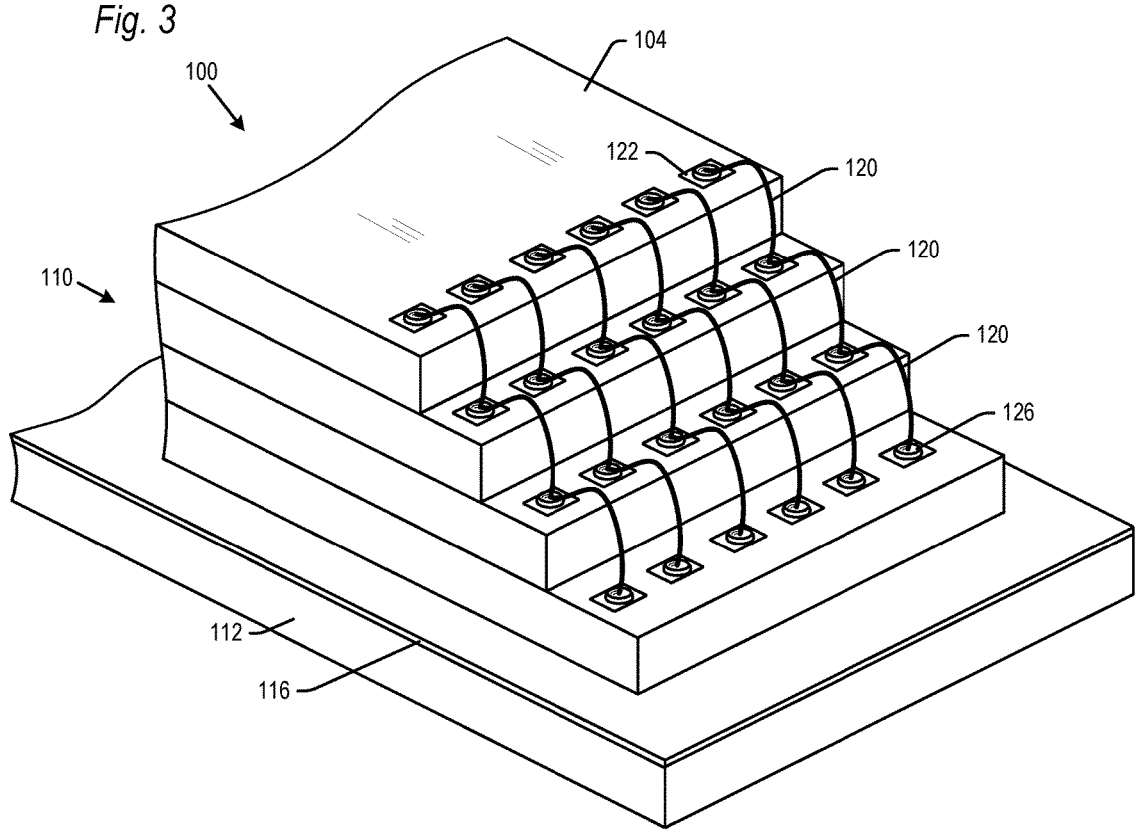
FIGS. 3 and 4 are partial perspective and edge views, respectively, of a semiconductor device according to an embodiment of the present technology at a first intermediate stage in the fabrication of the device.
Figure 4:
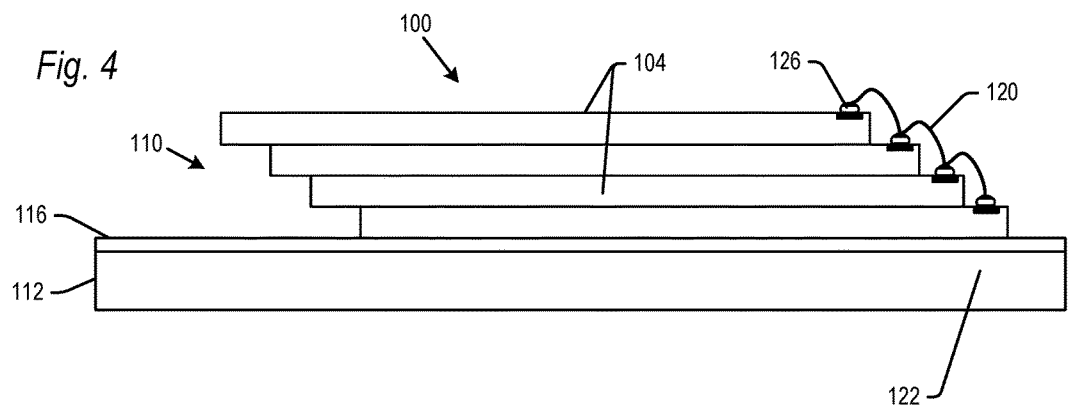

Referring now to the flowchart of FIG. 2 and the views of FIGS. 3 and 4, fabrication of a semiconductor package 100 may begin in step 200 with stacking a plurality of semiconductor die 104 on a rigid carrier 112. The semiconductor die 104 may for example be memory die such a NAND flash memory die, but other types of die 104 may be used. The semiconductor die 104 may be stacked atop each other in an offset stepped configuration to form a die stack 110. In the example shown, the semiconductor package 100 includes four semiconductor die 104. However, the die stack 110 may include more or less than four semiconductor die in further embodiments, including for example 2, 8, 16 and 32 semiconductor die. The die 104 may be affixed to each other in the stack 110 using a DAF (die attach film). As one example, the DAF may be 8988UV epoxy from Henkel Corp of California, USA.

The carrier 112 may be a thin plate formed of any of a variety of rigid, planar materials. In one embodiment, the rigid carrier 112 may be formed of a metal, such as for example stainless steel. However, the rigid carrier 112 to be formed of other materials in further embodiments, including for example silicon, silicon compounds, plastic or other polymers.

The die stack 110 may be affixed to the rigid carrier 112 using a temporary bonding film 116. At least initially, the bonding film 116 may be a B-stage adhesive that may be laminated onto the rigid carrier 112. The die 104 may stacked on the temporary bonding film 116 and cured or partially cured to temporarily bond the die stack 110 to the rigid carrier 112. As explained below, once fabrication of the package 100 is completed, the package 100 may be separated from the rigid carrier 112.

Figure 9:
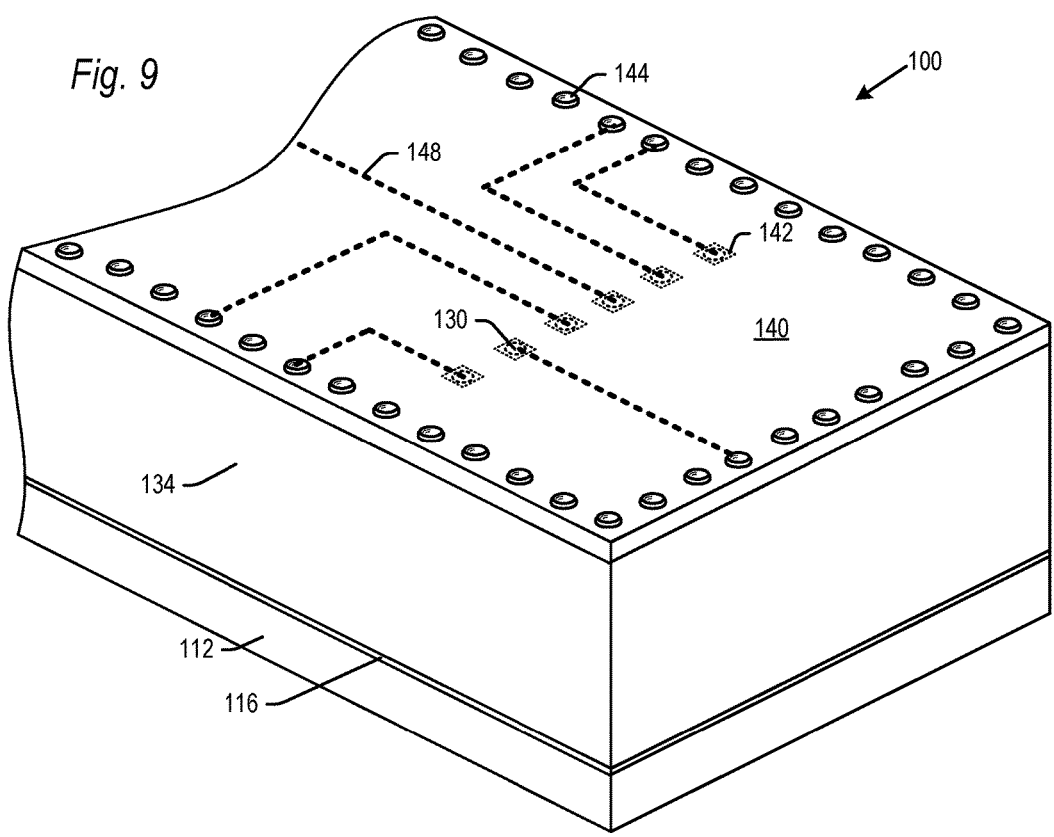
FIGS. 9 and 10 are partial perspective and edge views, respectively, of a semiconductor device according to an embodiment of the present technology at a first intermediate stage in the fabrication of the device.

Once the die stack 110 is formed, the respective die 104 in the stack 110 may be electrically connected to each other in step 204 using wire bonds 120. FIG. 3 shows a simplified perspective view with a few wire bonds shown for illustration purposes. There may be many more wire bonds 120 than shown. Each semiconductor die 104 may include a row of die bond pads 122 along an edge of the die 104. It is understood that each die 104 may include many more die bond pads 122 than is shown in FIG. 9. Each die bond pad 122 in the row of a semiconductor die may be electrically connected to the corresponding die bond pad 122 in the row of the next adjacent semiconductor die using a wire bond 120 formed as described below.

In embodiments, a stud bump 126 may initially be deposited on each of the die bond pads 122. Each stud bump 126 may be formed by forming a ball at the tip of a wire within a wire bond capillary by electronic flame off (EFO), and then affixing the stud bump 126 to a die bond pad 122 by pressure, elevated temperature and ultrasonic oscillation. In one embodiment, the stud bumps 126 may be formed under a pressure of 20 g at a temperature of 145° C. for about 12 ms using an ultrasonic frequency of 120 KHz. These parameters are by way of example only, and each may vary in further embodiments. Once a stud bump 126 is affixed, the wire bond capillary may pull away to break the wire and leave the stud bump 126.

After the stud bumps 126 are deposited on the bond pads 122, stitch wire bonds 120 may be formed on the stud bumps 126 on a die 104 (for example on the bottom die 104) up to the corresponding stud bumps 126 on the next higher die (for example the second die 104 from the bottom). This process may be repeated up the die stack 110 until wire bonds 120 are formed between all corresponding die bond pads 122 in a column of die bond pads in stack 110.

The wire bonds 120 may be formed by other methods in further embodiments, including wedge bonding and/or ball bonding. The wire bonds 120 are shown generally in a straight vertical column from one die to the next in the die stack 110. However, in further embodiments, one or more of the wire bonds may extend diagonally from one die to the next. Further, it may be that a wire bond skips one or more die in the die stack 110.

Figure 5:
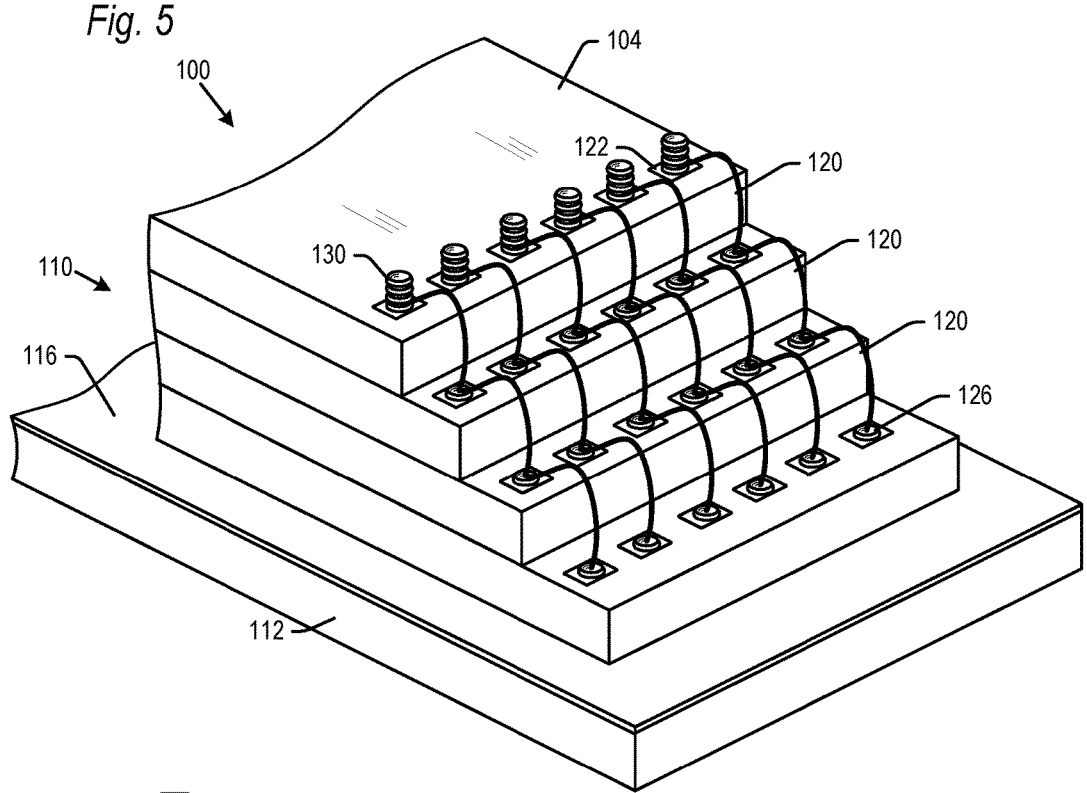
FIGS. 5 and 6 are partial perspective and edge views, respectively, of a semiconductor device according to an embodiment of the present technology at a second intermediate stage in the fabrication of the device.
Figure 6A:
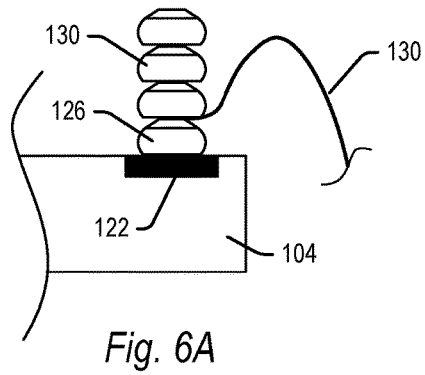
FIG. 6A is an enlarged partial edge view of an upper semiconductor die including a column of bumps according to an embodiment of the present technology.
Figure 6:
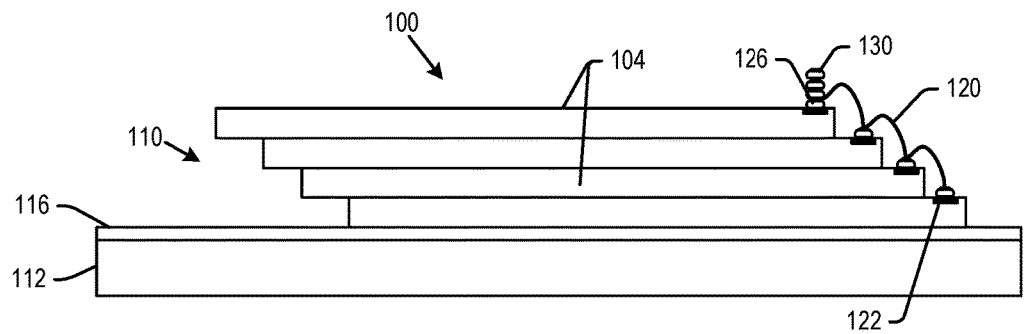

In step 208, one or more bumps 130 may be added to the wire bond on each die bond pad 122 of the top die 104 as shown in FIGS. 5 and 6 and the enlarged partial edge view of FIG. 6A. Each bump 130 may be formed for example of gold or gold alloy by stud bumping as explained above, i.e., by forming a ball at the tip of a wire within a wire bond capillary by EFO, and then affixing the bump 130 on the stud bump 126 and stitch wire bond 120 on the stud bump 126. The bumps 130 may be stacked in a vertical column directly on top of the stud bump 126 and wire bond 120.

In one embodiment, each bump 130 in each column of bumps 130 may be formed under a pressure of 18 g at a temperature of 145° C. for about 12 ms using an ultrasonic frequency of 120 KHz. These parameters are by way of example only, and each may vary in further embodiments. Once a first bump 130 in a column is affixed, the wire bond capillary may pull away to break the wire. The wire bond capillary may then deposit a second bump in the column, and so on until a column of bumps 130 is completed. Alternatively, the wire bond capillary may deposit a first bump 130 on each die bond pad 122 on the top die 104, the deposit a second bump 130 on the first bump on each die bond pad 122, and so on until all the bump columns are completed.

The number of bumps 130 in a column may vary in embodiments, but may be between one to four bumps 130 on top of stud bump 126. Each die bond pad 122 on the top die may have the same number of bumps 130, but it is conceivable that the number may vary in further embodiments. In embodiments, a bump 130 may have a height (in a direction perpendicular to bond pad 122) of between 30 µm and 33 µm, though the height may be lesser or greater than that range in further embodiments.

The size and number of bumps 130 in a vertical column are provided to a height that may be equal to or greater than the height of the wire bonds 120. In one example, this height may be about 110 µm. However, this height may vary and, as explained below, the height of the column of bumps 130 may be slightly less than the height of the wire bonds in further embodiments. Where bumps having a large height are used, less bumps may be used. Instead of a column of gold bumps, it is conceivable that one large solder bump be provided on top of the stud bump 126. As a further alternative, a column of other metal may be constructed on top of the stud bump 126.

Figure 7:
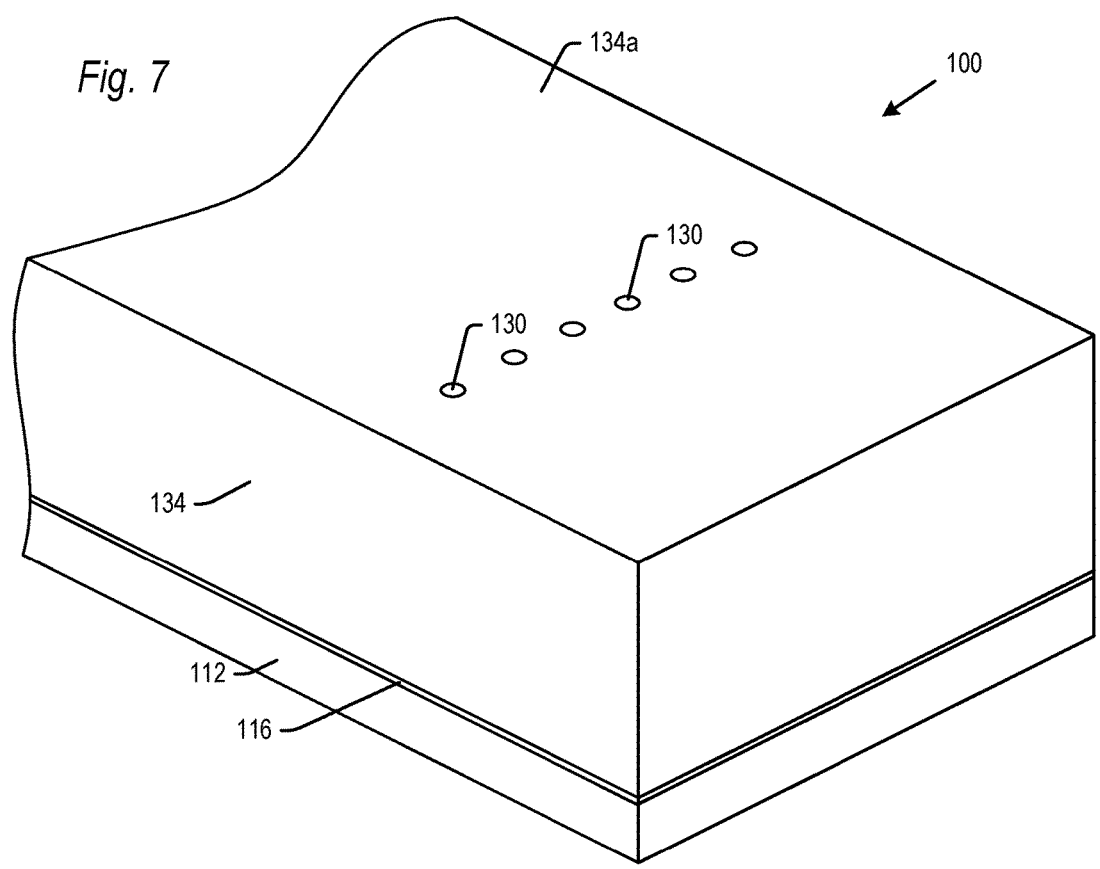
FIGS. 7 and 8 are partial perspective and edge views, respectively, of a semiconductor device according to an embodiment of the present technology at a first intermediate stage in the fabrication of the device.
Figure 8:
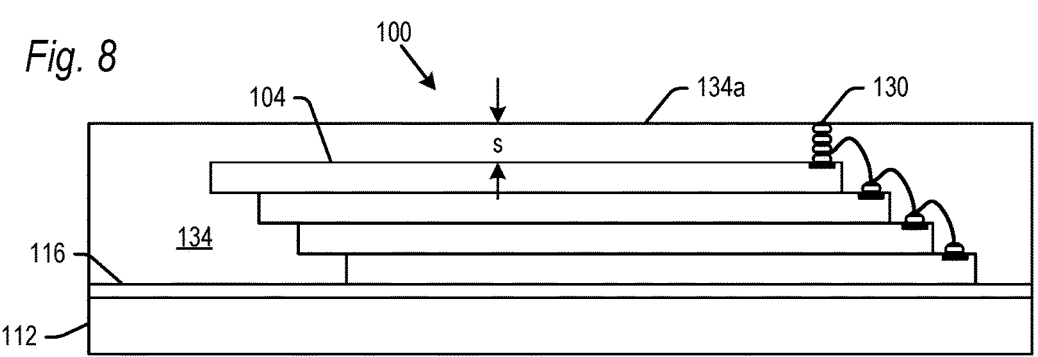

After formation of the columns of bumps 130 on the top die 104, the die may be encapsulated in a mold compound 134 in step 210 and as shown in FIGS. 7 and 8. The mold compound may be applied onto the surface of the rigid carrier 112, surrounding the semiconductor die 104 affixed to the rigid carrier 112. Mold compound 134 may include for example solid epoxy resin, Phenol resin, fused silica, crystalline silica, carbon black and/or metal hydroxide. Such mold compounds are available for example from Sumitomo Corp. and Nitto-Denko Corp., both having headquarters in Japan. Other mold compounds from other manufacturers are contemplated. The mold compound may be applied according to various known processes, including by FFT (flow free thin) molding, transfer molding or injection molding techniques.

As shown in the figures, the overall footprint (length and width) of a semiconductor die 104, and also the die stack 110, is smaller than a footprint of the mold compound 134. As explained below, an RDL pad may be affixed to the mold compound, which may have the same footprint as the surface of the mold compound to which it is attached. Having an enlarged RDL pad (the footprint of the mold compound rather than the footprint of the die) offers increased I/O relative to conventional chip-scale packages. As noted above and explained below, multiple semiconductor packages 100 may be formed on the rigid carrier 112. The mold compound may be applied across the entire surface of the rigid carrier 112, forming a block of mold compound encapsulating all of the packages 100 on the carrier 112.

As shown in FIG. 8, the mold compound may be applied so as to create a spacing, s, between the top die 104 and a surface 134a of the mold compound. The columns of bumps 130 are provided with a height to fill this spacing. Thus, as shown in FIG. 7, at least portions of the top bumps 130 in each column of bumps 130 on the top die 104 are exposed at or above the surface 134a of the mold compound 134. In a further embodiment (not shown) the highest portion of the wire bond 120 to the upper die may also be exposed through the surface of the mold compound 134. The mold compound 134 may undergo a polish or plasma process to ensure that surface 134a is flat and planar.

Figure 10:
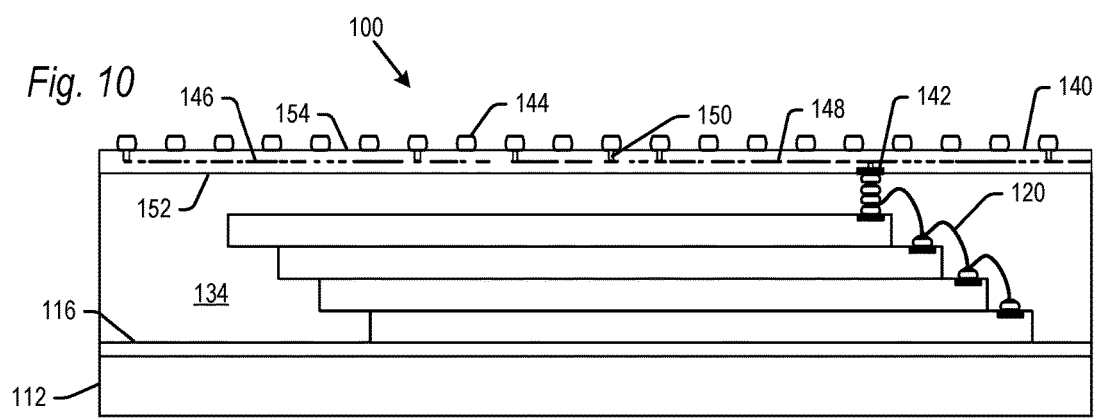

In step 214, a redistribution layer (RDL) pad 140 may be affixed to the surface 134a of mold compound 134 as shown in FIGS. 9 and 10. The RDL pad 140 includes a first surface having an adhesive to affix the RDL pad 140 directly to the surface 134a. The RDL pad 140 may have a length and width matching that of surface 134a of mold compound 134. The first surface of the RDL pad 140 includes a number of contact pads 142 having positions and a configuration to mate with the bumps 130 exposed through the surface 134a of mold compound 134. Thus, upon mounting of the RDL pad 140 to the mold compound 134, the contact pads 142 are electrically coupled to the column of bumps 130, and in turn to the die bond pads 122 of the semiconductor die 104.

RDL pad 140 is formed of an electrical conductance pattern 146 sandwiched between a first polyamide layer 152 having the surface affixed to the mold compound 134, and a second polyamide layer 154 at the opposite surface of the RDL pad 140. A pattern of solder balls 144 are provided on the surface of the second polyamide layer 154 (before or after the RDL pad 140 is affixed to the mold compound 134). The electrical conductance pattern 146 includes a number of electrical traces 148 and vias 150 which electrically couple the contact pads 142 with select ones of the solder balls 144 to electrically redistribute the contact pads 142 to the select ones of the solder balls 144. It is understood that the pattern of solder balls 144 and electrical traces 148 shown is by way of example only, and the RDL pad 140 may include other patterns of solder balls 144 and traces 148 having a greater or a fewer number of solder balls 144 and traces 148.

The wire bonds 120, column of bumps 130 and the RDL pad 140 electrically couple the die bond pads on the die 104 to select ones of solder balls 144 to enable communication between the semiconductor package 100 and a host device on which the package 100 is mounted, as explained below. The columns of bumps 130 provide the spacing needed between the upper semiconductor die 104 and the RDL pad 140 for the wire bonds 120, thus enabling multiple semiconductor die 104 to be included within the package 100. In further embodiments noted above, it is conceivable that one or more of the wire bonds 120 to the upper die 104 may be exposed through the surface of the mold compound 134. Should this occur, as the adjacent surface of the RDL pad 140 is formed of a polyamide insulator, electrical shorting of any exposed wire bonds 120 is prevented.

Figure 11:
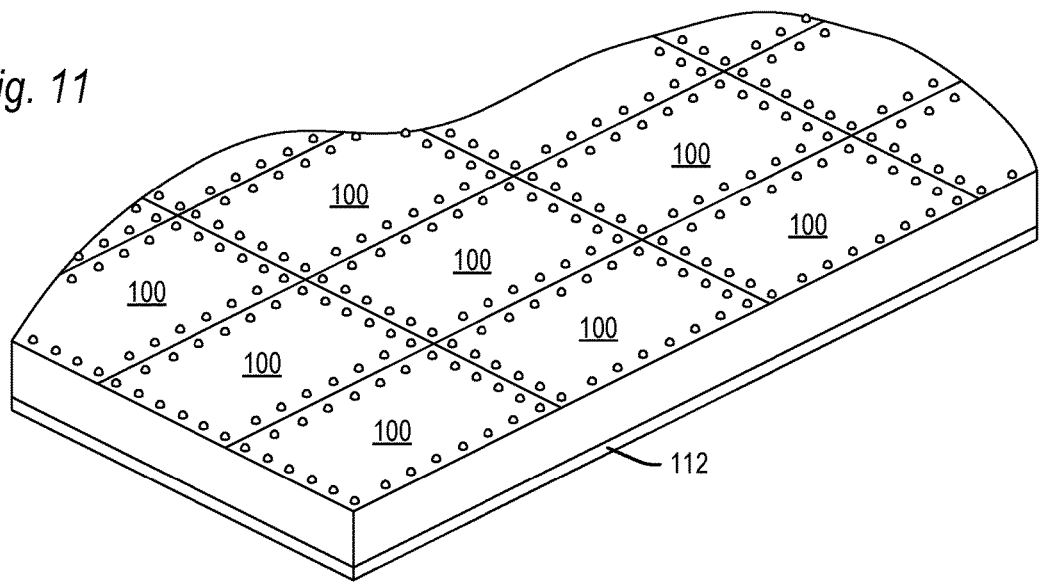
FIG. 11 is a partial perspective view of a panel of semiconductor devices fabricated according to embodiments of the present technology.
Figure 12:
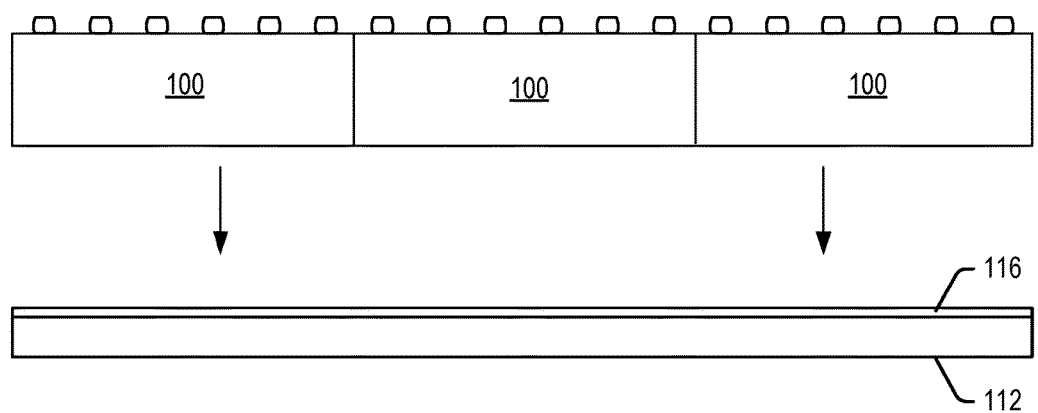
FIG. 12 is an edge view showing separation of the carrier from semiconductor devices fabricated according to embodiments of the present technology.

As noted, the semiconductor packages 100 may be mass-produced on the rigid carrier 112 as shown for example in the partial perspective view of FIG. 11. In step 218, the rigid carrier may be separated from the semiconductor packages 100, which remain affixed together within the block of mold compound 134. In step 220, the individual semiconductor packages 100 may be singulated from the block of mold compound to result in the finished encapsulated semiconductor packages 100.

As noted above, the rigid carrier 112 may be separated by any of a variety of processes, including thermal and mechanical processes which remove, neutralize or overcome the adhesive forces of the bonding film 116. In embodiments, the completed package 100 may be separated from the rigid carrier 112 in a thermal process, where the bonding film 116 is dissolved or the adhesive properties of the bonding film 116 are reduced or neutralized. An example of the bonding film 116 for use in such a thermal process is Revalpha from Nitto Denko Corporation of Osaka, Japan. In further embodiments, the completed package 100 may be separated from the rigid carrier in a mechanical separation process, where forces are applied between the die stack 110 and bonding film 116 that overcome the adhesive force of the bonding film. An example of the bonding film 116 for use in such a mechanical process is TM-X12-A1 from Hitachi Chemical Corporation, Ltd., Tokyo, Japan. Upon separation, the rigid carrier 112 may be discarded or reused.

The respective semiconductor packages 100 may be singulated by any of a variety of cutting methods including sawing, water jet cutting, laser cutting, water guided laser cutting, dry media cutting, and diamond coating wire cutting. While straight line cuts will define generally rectangular or square shaped semiconductor package 100, it is understood that semiconductor package 100 may have shapes other than rectangular and square in further embodiments of the present invention.

The flowchart of FIG. 2 shows the separation of the rigid carrier as occurring before the singulation step. However, the separation of the rigid carrier may occur after the singulation step in further embodiments. Additionally, the separation of the rigid carrier may occur simultaneously (as a result of) the singulation step.

Figure 13:
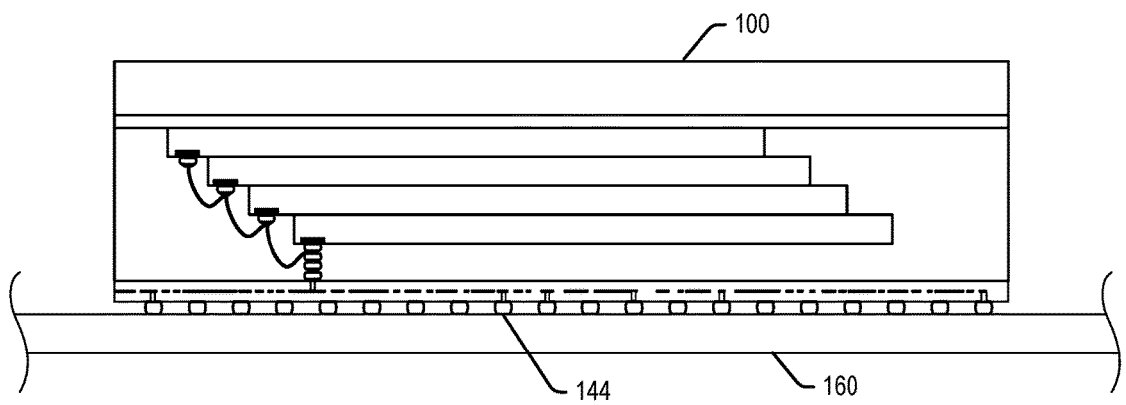
FIG. 13 is an edge view of a semiconductor device according to an embodiment of the present technology affixed to a host device.

Once singulated into individual semiconductor packages 100, the package 100 may be flipped over and affixed to a host device 160 as shown in FIG. 13. The host device may for example be a printed circuit board. The package 100 may be physically and electrically coupled to the host device 160 by solder balls 144 which may be hardened in a reflow process to permanently affix the package 100 to the host device 160.

Figure 14:
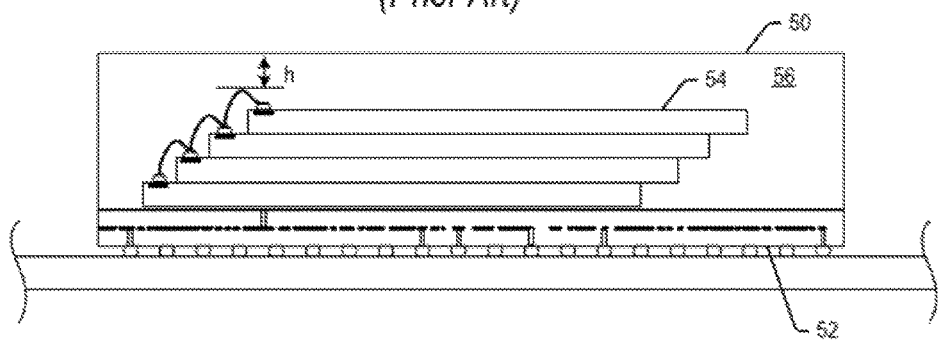
FIG. 14 is a side view of a conventional substrate semiconductor package.

The present technology provides a fan out semiconductor package capable of housing more memory die than conventional fan out chip-scale packages, thus providing increased memory capacity relative to conventional fan out chip-scale packages. The present technology further offers advantages over conventional substrate semiconductor packages. A conventional substrate semiconductor package 50 is shown in FIG. 14, including a substrate 52, a stack of semiconductor die 54 wire bonded to each other, and a mold compound 56. A conventional substrate 52 has a thickness of 80 µm to 100

μm. By comparison, the RDL pad 140 of FIG. 13 has a thickness of for example 10 μm to 20 μm. Thus, the RDL pad 140 offers a height savings of at least 60 μm over conventional substrate packages.

Additionally, conventional substrate packages need to provide the mold compound with a thickness which leaves a clearance height, h, above the highest wire bond to ensure that the wire bond is not exposed through a surface of the mold compound. This clearance height, h, is conventionally 95 μm to 110 μm. By comparison, the wire bond may be exposed through a surface of the mold compound in the package 100 according to the present technology. Thus, the clearance height in the package 100 of the present technology may be reduced or eliminated altogether, thus providing a further reduction in the height of package 100 relative to conventional substrate package.

Furthermore, as the bottom semiconductor die 54 in the conventional substrate package 50 needs to be affixed to the substrate 52 with a layer of DAF, there is one layer of DAF for every semiconductor die in the conventional substrate package. By contrast, the semiconductor package according to the present technology has one less DAF layer than there are semiconductor die (there is no DAF on the bottom or top surface of the die stack 110). Thus, as compared to conventional substrate semiconductor package 50, the package 100 according the present technology has a further reduction due to having one less DAF layer (for example 10 μm).

In embodiments, the present technology relates to a semiconductor package 100 that may be a fan out semiconductor package, where the electrical connections from the semiconductor die fan out, or are distributed to positions outside of the footprint of the semiconductor die and/or die stack. In particular, signals from the electrical contacts 142 are distributed to the solder balls 142 on the larger RDL pad 140. In embodiments, the semiconductor package 100 may also be a chip-scale package, or CSP. In embodiments the RDL pad 140 may have an area up to 1.2 times bigger than that of the semiconductor die 104 to which the column of solder balls 130 is affixed. The area of the RDL pad 140 may be smaller or larger than 1.2 times this semiconductor die in further embodiments.

In summary, in one example, the present technology relates to a semiconductor package, comprising: a plurality of stacked semiconductor die, each including die bond pads, the plurality of stacked semiconductor die including a first semiconductor die at a top of the stacked semiconductor die; mold compound, the plurality of semiconductor die encapsulated within the mold compound so that a surface of the first semiconductor die including the die bond pads is within the mold compound and spaced from a surface of the mold compound; wire bonds affixed on the die bond pads of the plurality of stacked semiconductor die, the wire bonds electrically coupling the plurality of stacked semiconductor die; columns of one or more bumps formed on top of the wire bonds at the die bond pads on the first semiconductor die, the one or more bumps of each column having a surface of a bump exposed through the surface of the mold compound; a redistribution layer (RDL) pad affixed to the surface of the mold compound, the redistribution layer pad comprising: contact pads on a first surface of the RDL pad mating with the exposed bump of each column at the surface of the mold compound, solder bumps on a second surface of the RDL pad, and a conductance pattern for electrically connecting the contact pads on the first surface of the RDL pad with select ones of the solder bumps on the second surface of the RDL pad.

In a further example, the present technology relates to a semiconductor package, comprising: a semiconductor package, comprising: a plurality of stacked semiconductor die, each including die bond pads, the plurality of stacked semiconductor die including a first semiconductor die at a top of the stacked semiconductor die; mold compound, the plurality of semiconductor die encapsulated within the mold compound, a surface of the first semiconductor die including the die bond pads embedded within the mold compound to define a spacing between the surface of the first semiconductor die and a surface of the mold compound; wire bonds affixed on the die bond pads of the plurality of stacked semiconductor die, the wire bonds electrically coupling the plurality of stacked semiconductor die, the wire bonds to the die bond pads on the first semiconductor die provided in the spacing between the surface of the first semiconductor die and a surface of the mold compound; columns of one or more bumps formed on top of the wire bonds at the die bond pads on the first semiconductor die, the one or more bumps of each column filling the spacing between the surface of the first semiconductor die and a surface of the mold compound; a redistribution layer (RDL) pad affixed to the surface of the mold compound, the redistribution layer pad comprising: contact pads on a first surface of the RDL pad mating with the exposed bump of each column at the surface of the mold compound, solder bumps on a second surface of the RDL pad, and a conductance pattern for electrically connecting the contact pads on the first surface of the RDL pad with select ones of the solder bumps on the second surface of the RDL pad.

In another example, the present technology relates to a fan out semiconductor package, comprising: a plurality of stacked semiconductor die, each including die bond pads, the plurality of stacked semiconductor die including a first semiconductor die at a top of the stacked semiconductor die; mold compound, the plurality of semiconductor die encapsulated within the mold compound, a surface of the first semiconductor die including the die bond pads embedded within the mold compound to define a spacing between the surface of the first semiconductor die and a surface of the mold compound; wire bonds affixed on the die bond pads of the plurality of stacked semiconductor die, the wire bonds electrically coupling the plurality of stacked semiconductor die, the wire bonds to the die bond pads on the first semiconductor die provided in the spacing between the surface of the first semiconductor die and a surface of the mold compound; a redistribution layer (RDL) pad affixed to the surface of the mold compound, the redistribution layer pad comprising: contact pads on a first surface of the RDL pad, solder bumps on a second surface of the RDL pad, and a conductance pattern for electrically connecting the contact pads on the first surface of the RDL pad with select ones of the solder bumps on the second surface of the RDL pad; and means, provided in the spacing, to electrically couple the contact pads of the RDL pad with the die bond pads of the first semiconductor die.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A semiconductor package, comprising:
   a plurality of stacked semiconductor die, each including die bond pads, the plurality of stacked semiconductor die including a first semiconductor die at a top of the stacked semiconductor die;
   mold compound, the plurality of semiconductor die encapsulated within the mold compound so that a surface of the first semiconductor die including the die bond pads is within the mold compound and spaced from a surface of the mold compound;
   wire bonds affixed on the die bond pads of the plurality of stacked semiconductor die, the wire bonds electrically coupling the plurality of stacked semiconductor die;
   columns of one or more bumps formed on top of the wire bonds at the die bond pads on the first semiconductor die, the one or more bumps of each column having a surface of a bump exposed through the surface of the mold compound;
   a redistribution layer (RDL) pad affixed to the surface of the mold compound, the redistribution layer pad comprising:
      contact pads on a first surface of the RDL pad mating with the exposed bump of each column at the surface of the mold compound,
      solder bumps on a second surface of the RDL pad, and
      a conductance pattern for electrically connecting the contact pads on the first surface of the RDL pad with select ones of the solder bumps on the second surface of the RDL pad.

2. The semiconductor package of claim 1, wherein a height a column of bumps above a die bond pad is greater than or equal to a height of a wire bond over the die bond pad.

3. The semiconductor package of claim 1, wherein wire bonds to the die bond pads of the first semiconductor die are completely encased within the mold compound.

4. The semiconductor package of claim 1, wherein a wire bonds to a die bond pad of the first semiconductor die is exposed through the surface of the mold compound.

5. The semiconductor package of claim 1, wherein there are between one and four bumps in a column of bumps.

6. The semiconductor package of claim 1, wherein the wire bond comprises a stud bump on the die bond pads of the first semiconductor die.

7. The semiconductor package of claim 6, wherein there are between one and four bumps stacked on top of the stud bump.

8. The semiconductor package of claim 1, wherein a footprint of the RDL pad is the same as a footprint of the surface of the mold compound.

9. The semiconductor package of claim 8, wherein the footprint of the RDL pad and surface of the mold compound is larger than a footprint of the plurality of stacked semiconductor die.

10. The semiconductor package of claim 1, wherein the wire bond comprises a stud bump on the die bond pads of the first semiconductor die.

11. The semiconductor package of claim 10, wherein there are between one and four bumps stacked on top of the stud bump.

12. A semiconductor package, comprising:
    a plurality of stacked semiconductor die, each including die bond pads, the plurality of stacked semiconductor die including a first semiconductor die at a top of the stacked semiconductor die;
    mold compound, the plurality of semiconductor die encapsulated within the mold compound, a surface of the first semiconductor die including the die bond pads embedded within the mold compound to define a spacing between the surface of the first semiconductor die and a surface of the mold compound;
    wire bonds affixed on the die bond pads of the plurality of stacked semiconductor die, the wire bonds electrically coupling the plurality of stacked semiconductor die, the wire bonds to the die bond pads on the first semiconductor die provided in the spacing between the surface of the first semiconductor die and a surface of the mold compound;
    columns of one or more bumps formed on top of the wire bonds at the die bond pads on the first semiconductor die, the one or more bumps of each column filling the spacing between the surface of the first semiconductor die and a surface of the mold compound;
    a redistribution layer (RDL) pad affixed to the surface of the mold compound, the redistribution layer pad comprising:
       contact pads on a first surface of the RDL pad mating with the exposed bump of each column at the surface of the mold compound,
       solder bumps on a second surface of the RDL pad, and
       a conductance pattern for electrically connecting the contact pads on the first surface of the RDL pad with select ones of the solder bumps on the second surface of the RDL pad.

13. The semiconductor package of claim 12, wherein a height a column of bumps above a die bond pad is greater than or equal to a height of a wire bond over the die bond pad.

14. The semiconductor package of claim 12, wherein wire bonds to the die bond pads of the first semiconductor die are completely encased within the mold compound.

15. The semiconductor package of claim 12, wherein a wire bonds to a die bond pad of the first semiconductor die is exposed through the surface of the mold compound.

16. The semiconductor package of claim 12, wherein there are between one and four bumps in a column of bumps.

17. A fan out semiconductor package, comprising:
    a plurality of stacked semiconductor die, each including die bond pads, the plurality of stacked semiconductor die including a first semiconductor die at a top of the stacked semiconductor die;
    mold compound, the plurality of semiconductor die encapsulated within the mold compound, a surface of the first semiconductor die including the die bond pads embedded within the mold compound to define a spacing between the surface of the first semiconductor die and a surface of the mold compound;
    wire bonds affixed on the die bond pads of the plurality of stacked semiconductor die, the wire bonds electrically coupling the plurality of stacked semiconductor die, the wire bonds to the die bond pads on the first semiconductor die provided in the spacing between the surface of the first semiconductor die and a surface of the mold compound;
    a redistribution layer (RDL) pad affixed to the surface of the mold compound, the redistribution layer pad comprising:
       contact pads on a first surface of the RDL pad,
       solder bumps on a second surface of the RDL pad, and a conductance pattern for electrically connecting the contact pads on the first surface of the RDL pad with select ones of the solder bumps on the second surface of the RDL pad; and means, provided in the spacing, to electrically couple the contact pads of the RDL pad with the die bond pads of the first semiconductor die.

18. The semiconductor package of claim 17, wherein the means comprise a column of stud bumps formed of the same material as the wire bonds.

19. The semiconductor package of claim 17, wherein the means comprise a solder bump.

20. The semiconductor package of claim 17, wherein the means comprise a column of conductive material.

\* \* \* \* \*